US009209009B2

(12) United States Patent
Traunspurger et al.

(10) Patent No.: US 9,209,009 B2
(45) Date of Patent: Dec. 8, 2015

(54) CHUNK POLYCRYSTALLINE SILICON AND PROCESS FOR CLEANING POLYCRYSTALLINE SILICON CHUNKS

(71) Applicants: Gerhard Traunspurger, Berchtesgaden, DE (US); Laszlo Fabry, Burghausen, DE (US); Reiner Pech, Neuoetting, DE (US)

(72) Inventors: Gerhard Traunspurger, Berchtesgaden, DE (US); Laszlo Fabry, Burghausen, DE (US); Reiner Pech, Neuoetting, DE (US)

(73) Assignee: Wacker Chemie AG, Munich (DE)

( * ) Notice: Subject to any disclaimer, the term of this patent is extended or adjusted under 35 U.S.C. 154(b) by 529 days.

(21) Appl. No.: 13/772,756

(22) Filed: Feb. 21, 2013

(65) Prior Publication Data

US 2013/0216466 A1 Aug. 22, 2013

(30) Foreign Application Priority Data

Feb. 21, 2012 (DE) .......................... 10 2012 202 640

(51) Int. Cl.
| | | |
|---|---|---|
| *C01B 33/02* | (2006.01) | |
| *H01L 21/02* | (2006.01) | |
| *C01B 33/037* | (2006.01) | |
| *C30B 11/00* | (2006.01) | |
| *C30B 13/00* | (2006.01) | |
| *C30B 15/00* | (2006.01) | |
| *C30B 29/06* | (2006.01) | |

(52) U.S. Cl.
CPC .......... *H01L 21/02046* (2013.01); *C01B 33/02* (2013.01); *C01B 33/037* (2013.01); *C30B 11/00* (2013.01); *C30B 13/00* (2013.01); *C30B 15/00* (2013.01); *C30B 29/06* (2013.01); *C01P 2002/88* (2013.01); *C01P 2002/89* (2013.01); *C01P 2002/90* (2013.01); *C01P 2006/80* (2013.01)

(58) Field of Classification Search
CPC .. H01L 21/02046; C30B 29/06; C30B 11/00; C30B 13/00; C30B 15/00; C01B 33/037; C01B 33/02; C01P 2006/80; C01P 2002/88; C01P 2002/89; C01P 2002/90
See application file for complete search history.

(56) References Cited

U.S. PATENT DOCUMENTS

| | | | |
|---|---|---|---|
| 4,555,303 | A | 11/1985 | Legge et al. |
| 5,361,128 | A | 11/1994 | Bourbina et al. |
| 5,436,164 | A | 7/1995 | Dumler et al. |
| 5,445,679 | A | 8/1995 | Hansen et al. |
| 2003/0159647 | A1 | 8/2003 | Arvidson et al. |
| 2010/0154357 | A1 | 6/2010 | Wochner et al. |
| 2010/0219380 | A1 | 9/2010 | Hertlein et al. |
| 2012/0058040 | A1 | 3/2012 | Haeckl et al. |

FOREIGN PATENT DOCUMENTS

| | | | |
|---|---|---|---|
| DE | 4137521 | A1 | 5/1992 |
| DE | 4330598 | A1 | 4/1994 |
| DE | 102010040293 | A1 | 3/2012 |
| EP | 0338682 | A2 | 10/1989 |
| EP | 2426085 | A1 | 3/2012 |
| JP | 2000-302594 | A † | 10/2000 |
| JP | 2000302594 | A | 10/2000 |
| JP | 2002-293688 | A † | 10/2002 |
| WO | 2009047107 | A2 | 4/2009 |

OTHER PUBLICATIONS

Database WPI Week 200011, Thomson Scientific, London, GB; AN 2000-119475 / XP002698146 & JP H 11 335197 A (Nippon Steel Corp) (Dec. 7, 1999).
Database WPI Week 200909, Thomson Scientific, London, GB; AN 2009-E34524 / XP002698147 & JP 2009 018967 A (Sharp KK) (Jan. 29, 2001).
PatBase abstract for JP 2000302594.

† cited by third party

*Primary Examiner* — Anthony J Zimmer
(74) *Attorney, Agent, or Firm* — Caesar Rivise, PC

(57) ABSTRACT

The invention provides chunk polycrystalline silicon having a concentration of carbon at the surface of 0.5-35 ppbw. A process for cleaning polycrystalline silicon chunks having carbon contaminations at the surface, includes a thermal treatment of the polycrystalline silicon chunks in a reactor at a temperature of 350 to 600° C., the polycrystalline silicon chunks being present in an inert gas atmosphere during the thermal treatment, and the polycrystalline silicon chunks after the thermal treatment having a concentration of carbon at the surface of 0.5-35 ppbw.

12 Claims, No Drawings

CHUNK POLYCRYSTALLINE SILICON AND PROCESS FOR CLEANING POLYCRYSTALLINE SILICON CHUNKS

BACKGROUND OF THE INVENTION

The invention provides chunk polycrystalline silicon and a process for cleaning polycrystalline silicon chunks.

Polycrystalline silicon serves as a starting material in the production of monocrystalline silicon by means of crucible pulling (Czochralski or CZ process) or by means of zone melting (float zone or FZ process).

More particularly, however, polycrystalline silicon is required for production of mono- or multicrystalline silicon by means of pulling or casting processes, this mono- or multicrystalline silicon serving for production of solar cells for photovoltaics.

On the industrial scale, crude silicon is obtained by the reduction of silicon dioxide with carbon in a light arc furnace at temperatures of about 2000° C.

This affords "metallurgical grade" silicon ($Si_{mg}$) having a purity of about 98-99%.

For applications in photovoltaics and in microelectronics, the metallurgical grade silicon has to be purified.

For this purpose, it is reacted, for example, with gaseous hydrogen chloride at 300-350° C. in a fluidized bed reactor to give a silicon-containing gas, for example trichlorosilane. This is followed by distillation steps in order to purify the silicon-containing gas.

This high-purity silicon-containing gas then serves as a starting material for the production of high-purity polycrystalline silicon.

The polycrystalline silicon, often also called polysilicon for short, is typically produced by means of the Siemens process. This involves heating thin filament rods of silicon by direct passage of current in a bell-shaped reactor ("Siemens reactor"), and introducing a reaction gas comprising a silicon-containing component and hydrogen.

In the Siemens process, the filament rods are typically inserted perpendicularly into electrodes present at the reactor base, through which they are connected to the power supply. Every two filament rods are coupled via a horizontal bridge (likewise composed of silicon) and form a support body for the silicon deposition. The bridge coupling produces the typical U shape of the carrier bodies, which are also called thin rods.

High-purity polysilicon is deposited on the heated rods and the bridge, as a result of which the rod diameter grows with time (CVD/gas phase deposition).

After the deposition has ended, these polysilicon rods are typically processed further by means of mechanical processing to give chunks of different size classes, classified, optionally subjected to a wet-chemical purification and finally packed.

The silicon-containing component of the reaction gas used in the deposition of polycrystalline silicon is generally monosilane or a halosilane of the general composition $SiH_nX_{4-n}$ (n=0, 1, 2, 3; X=Cl, Br, I), or a mixture of halosilanes. The halosilane may be a chlorosilane, for example trichlorosilane. Predominantly $SiH_4$ or $SiHCl_3$ (trichlorosilane, TCS) is used in a mixture with hydrogen.

The carbonaceous impurities present in the silicon-containing component of the reaction gas lead to a slight but critically quality-reducing carbon contamination of the silicon deposited therefrom.

This carbon contamination in the silicon bulk is typically up to 50 ppba.

The operations in mechanical processing, up to the packing of the polysilicon, for the most part proceed with full automation. In the course of this, the surface of the silicon particles is contaminated with various metals from the grinding and crushing tools, but also with organic molecules and organic macromolecules (organics).

One cause of the contamination of the polycrystalline silicon with organics is contact, which is not entirely avoidable, of the silicon with components made from an organic polymer or plastic during the mechanical operations.

This surface contamination with carbon compounds is several times higher than the above-described carbon contamination during the gas phase deposition.

This surface contamination of the polysilicon with organics leads to adverse effects for the customer and in customer operations, for example in the production of polycrystalline solar cells:

In the production of polycrystalline solar cells, for example in the block casting process, during the silicon melting and cooling operations, a portion of the organic carbon is incorporated into the polycrystalline silicon block in the form of silicon carbide precipitates. These inclusions lead to adverse effects in the sawing of the sheets as a result of more frequent wire fracture in the wire saw, but also to adverse electrical properties of the material, for example "shunts", which are ultimately manifested in a poorer efficiency and performance of a solar cell.

For minimization of carbon contamination on silicon surfaces, various methods are known in the prior art.

U.S. Pat. No. 5,445,679A describes a process for cleaning the surface of polycrystalline silicon. In this process, the intention is to transfer organic impurities (unhalogenated and halogenated hydrocarbons) to volatile or gaseous carbon species by contacting with an oxidative atmosphere, and to remove them from the surface. The oxidative atmosphere used is an oxidative plasma which is generated by a conventional high-frequency generator in the plasma gas. The plasma gas used is, according to the oxidation potential required, an inert gas (for example He, Ne, Ar, Kr, Rn or Xe) having an oxygen content of <20%, pure oxygen, pure inert gas, oxygen and halogen, inert gas and halogen, or pure halogen.

However, the apparatus complexity of this process is high since a vacuum tight oxidation reactor with generation of vacuum and plasma is required. Moreover, it is very energy-intensive with comparatively long processing times. In addition, the polysilicon purified by means of oxidative plasma exhibits higher reactivity and hence additional adsorption, such that the plasma-cleaned material in the course of further processing (single crystal pulling) in some cases exhibits higher contamination than non-plasma-cleaned material.

U.S. Pat. No. 4,555,303A describes a process for removing carbonaceous material from, for example, silicon surfaces. This involves exposing the material to be cleaned, in a reactor, to a high-pressure oxygen plasma (in the examples, helium-oxygen mixture having an oxygen content of 32% in each case). The reactive and ionic oxygen species generated in the high-pressure high-frequency plasma lead to a reaction of the carbonaceous layer and hence to oxidation of these impurities. The reaction products, carbon dioxide and possibly a nonoxidized residue (ash material), can be removed readily from the silicon surface with an aqueous solution of sodium hydroxide.

However, the apparatus complexity of this process is high, since a vacuum-tight oxidation reactor with generation of plasma is required. Moreover, the process is very energy-intensive with comparatively long processing times. The wet purification at the end of the process leads to an increased level of complexity and hence to high costs resulting from the purchasing, workup and destruction of chemicals. In addition, the polysilicon cleaned by means of oxidative plasma—as known from U.S. Pat. No. 5,445,679A—exhibits higher reactivity and hence additional adsorption, such that the plasma-cleaned material in the course of further processing (single crystal pulling) exhibits higher contamination than a non-plasma-cleaned material.

US 2010154357A discloses a process in which the contamination of chunk silicon is minimized during automatic packing into a plastic bag. To reduce the contamination, including the contamination with carbon, the bags are filled using freely suspended and movable energy absorbers. These energy absorbers for reduction of the momentum of the chunk silicon on the plastic bag consist of a low-contamination plastic. A low-contamination material is understood to mean a material which, after contact with the polysilicon, contaminates the surface thereof to the following maximum extent: carbon less than 300 pptw. This was shown by determining the weight of the tubular plastic before and after the filling of the bags. This showed polymer abrasion (=carbon abrasion) below the detection limit of 0.1 mg per 400 kg, and hence below the required 300 ng per kg of Si (=300 pptw). This process relates only to the limitation of contamination in the course of packing.

US 20030159647A1 discloses "flowable chips" of polycrystalline silicon having a maximum concentration of 0.17 ppma (170 ppba) of carbon in the bulk (bulk contamination). US 20030159647A1 does not give any information as to the concentration of carbon at the surface.

DE 4137521A1 describes a process for analyzing traces of impurities on particulate silicon. This involves introducing a particular mass of the particulate silicon into a silicon vessel, likewise of known mass and quality. This filled silicon vessel is subsequently subjected to a zone pulling process (float zone), which leads to a monolithic unit of monocrystalline silicon between vessel and particulate silicon. The surface impurities of the particulate silicon are thus distributed into the bulk of single crystal formed from the process described. A wafer is subsequently sawn out of the single crystal, chemically cleaned and analyzed. The quantitative analysis of the impurities present in the silicon wafer is conducted by means of standard methods, such as photoluminescence analysis, FTIR spectroscopy and atomic absorption spectroscopy. The concentrations of the impurities of the particulate silicon can subsequently be determined by simple allegation. The content of carbon impurities in sieved silicon fragments is reported as <50 ppb.

DE 4330598A1 describes a process for analysis of traces of impurities in irregularly shaped silicon chunks on the surface and in the bulk. This silicon chunk must have a diameter between 4 and 22 mm and a length of 5 to 20 cm. This involves subjecting a zone-meltable silicon chunk to a crucible-free zone melting process. The surface impurities of the irregular body are thus distributed into the bulk of the single crystal formed from the process described. Subsequently, a wafer is sawn out of the single crystal, chemically cleaned and analyzed. The quantitative analysis of the impurities present in the silicon wafer is conducted by means of standard methods, such as photoluminescence analysis, FTIR spectroscopy and atomic absorption spectroscopy.

The problems described gave rise to the objective of the invention. This was to provide an improved process for removing contamination with carbon at the surface of polycrystalline silicon, and to make available a polycrystalline silicon having less carbon at the surface than in the prior art.

DESCRIPTION OF THE INVENTION

The object of the invention is achieved by chunk polycrystalline silicon having a concentration of carbon at the surface of 0.5-35 ppbw.

The concentration of carbon at the surface is preferably 0.5-20 ppbw.

The concentration of carbon at the surface is more preferably 0.5-10 ppbw.

The polycrystalline silicon is in the form of chunks. The polycrystalline silicon is characterized by a surface comprising fissured, deep and unordered tips, depressions, fracture edges, blisters and cracks.

The polycrystalline silicon of the present invention is to be distinguished from polycrystalline silicon in granule form. The latter is produced in a fundamentally different process (fluidized bed reactor), and need not subsequently be comminuted or crushed, since it already has bulk material properties after production. Polysilicon granules consist of approximately spherical particles of size 100-3000 μm. Up to 100-fold magnification, the particles do not show any signs of mechanical processing, i.e., no fracture edges whatsoever are visible. Granules do not form part of the subject matter of the present invention.

The concentration of carbon within the polycrystalline silicon chunk is preferably not more than 10 ppba. The concentration of carbon within is preferably 1 to 5 ppba. The concentration of carbon within is most preferably below the detection limit of 1 ppba=0.43 ppbw.

The values reported for surface carbon for the chunk polycrystalline silicon apply irrespective of the fracture size, which is defined as the longest distance between two points on the surface of a silicon chunk (=max. length) as follows:
chunk size 0 in mm: approx. 0.5 to 5
chunk size 1 in mm: approx. 3 to 15
chunk size 2 in mm: approx. 10 to 40
chunk size 3 in mm: approx. 20 to 60
chunk size 4 in mm: approx. >45

Production of the Polycrystalline Silicon

There follows an explanation of how the inventive chunk polycrystalline silicon can be produced.

a) Deposition of the Polycrystalline Silicon in a Siemens Reactor

Polycrystalline silicon is deposited on heated thin silicon rods, using a silicon-containing component and hydrogen as the reaction gas. The silicon-containing component is preferably a chlorosilane, more preferably trichlorosilane.

The deposition is effected according to the prior art, an example of a reference being WO 2009/047107 A2.

In order to achieve a concentration of carbon within the polycrystalline silicon of 1 ppba or less, preference is given to using the process described in the unpublished German application with the reference 102010040293.1.

It envisages two deposition reactors for deposition of polysilicon from trichlorosilane (TCS) and hydrogen, with supply of a purified condensate from the offgas of a first deposition reactor to a second reactor and use thereof for deposition of polysilicon.

Separate hydrogen circuits are envisaged for the deposition reactors, these being separate from one another for material purposes. In addition, the hydrogen circuit of the first deposition is controlled such that the TCS flow of the second deposition can thus be controlled.

The offgas from the first deposition process is first condensed and then purified by means of distillation, before it is used in the second deposition process.

b) Commination of the Polycrystalline Silicon

After the deposition in the Siemens reactor, the silicon rods are removed from the reactor.

To produce the inventive silicon, the polysilicon rod is first precomminuted.

For this purpose, a hammer made from a low-abrasion material, for example hard metal, is used. Any hammer shaft consists of plastic.

The plastic used is selected from one or more elements from the group consisting of polypropylene, polyethylene, polyvinylidene fluoride (PVDF), polyurethane (PUR) and polyamide (PA).

The precomminution is effected on a workbench having a surface which consists preferably of low-wear plastic or of silicon.

The plastic used is likewise selected from one or more elements from the group consisting of polypropylene, polyethylene, polyvinylidene fluoride (PVDF), polyurethane (PUR) and polyamide (PA).

This is followed by comminution of the precomminuted polysilicon to the desired target size of chunk size 0, 1, 2, 3 or 4.

The comminution is effected by means of a crusher, for example with a jaw crusher.

Such a crusher is described, for example, in EP 338 682 A2.

Subsequently, the crushed silicon is classified into chunk sizes by means of a mechanical sieve, the mechanical sieve being lined with plastic or with silicon.

The plastic used is in turn selected from one or more elements from the group consisting of polypropylene, polyethylene, polyvinylidene fluoride (PVDF), polyurethane (PUR) and polyamide (PA).

Both systems, both workbench and hammer for precomminution, and crusher, are present in a cleanroom of class 10,000 or lower.

The systems are preferably present in a cleanroom of class 100 or better (to US FED STD 209E, superseded by ISO 14644-1).

In the case of class 100 (ISO 5), max. 3.5 particles of max. diameter 0.5 µm may be present per liter.

In the cleanroom, preference is given to implementation of an ionization system in order to neutralize electrostatic charges by active air ionization. Ionizers permeate the cleanroom air with ions such that static charges on insulators and ungrounded conductors are dissipated.

For lining of metal parts on the crusher, at least one plastic is used, selected from one or more elements from the group consisting of polypropylene, polyethylene, polyvinylidene fluoride (PVDF), polyurethane (PUR) and polyamide (PA).

c) Cleaning of the Polycrystalline Silicon by Thermal Treatment

The comminution operations are followed by a thermal treatment of the polycrystalline silicon.

The object of the invention is namely also achieved by a process for cleaning polycrystalline silicon having carbon contaminations at the surface, comprising a thermal treatment of the polycrystalline silicon in a reactor at a temperature of 350 to 600° C., the polycrystalline silicon being present in an inert gas atmosphere, and the polycrystalline silicon after the thermal treatment having a concentration of carbon at the surface of 0.5-35 ppbw.

The thermal treatment is preferably effected in an oven.

An example of a suitable oven for this purpose is a tunnel oven of the DM 900/11 type from THERMCONCEPT Dr. Fischer GmbH & Co. KG.

Preference is given to thermal treatment at a constant inert gas flow between 0-250 L/min.

The process is preferably performed at a low positive inert gas pressure of approx. 50 hPa relative to the atmosphere.

The inert gases used may be noble gases or nitrogen.

The noble gas used is preferably argon and not nitrogen in order to prevent any silicon nitride formation.

The thermal treatment is effected with exclusion of oxygen. It is thus possible to avoid adsorptive oxidized silicon surface which can lead to recontamination.

The thermal treatment is preferably effected only briefly for a duration of up to 180 s, but preferably for at least 30 s.

The thermal treatment is preferably effected at a temperature of 450 to 550° C.

During the thermal treatment, the polycrystalline silicon is preferably present on one or more dishes made of quartz or made of silicon. For example, an amount of 5 kg of crushed or granular silicon may be present on such a dish.

The thermal treatment is followed by cooling of the thermally treated polysilicon outside the oven to approximately room temperature with inert gas purging.

In the context of the development of this cleaning process, it has been found that specific plastics, such as polyethylene and polypropylene, can be removed quantitatively from surfaces of polycrystalline silicon by heating the silicon briefly in an oven, ideally under an inert gas stream and with a controlled heating ramp, and then allowing it to cool again in the inertized state.

The controlled heating of the silicon to be treated is preferably accomplished as follows:

The tunnel oven is operated at constant process temperature.

The polycrystalline silicon to be treated, which has been spread uniformly on the process dish, is applied to the chain conveyor of the tunnel oven and conveyed into the oven chamber with inert gas purging.

Since a treatment of the surface of the process material is conducted in the oven, complete heating of the entire mass of the process material is unnecessary.

With a constant silicon mass per process dish (approx. 5 kg) and ideal distribution of the silicon on the process dish, a constant heating time of 30 s was determined, which is sufficient to heat the carbonaceous impurities on the surface of the polycrystalline silicon and the uppermost silicon layer of the silicon particles from room temperature to process temperature.

The process material is cooled to room temperature in the inertized state after the passage of the laden process dish through the oven chamber in the cooling unit of the tunnel oven within 3 minutes.

It is advantageous that, in the processes immediately prior to the cleaning, no considerable technical complexity is required for a minimization of the surface contamination of the polysilicon particles or chunks with abraded polymer; it is necessary merely to ensure that polymeric assistants which can be removed easily with the aid of the thermal process described are used.

The result is surprising, especially since thermodynamic laws lead to somewhat different expectations from the reaction between carbonaceous surface contamination and a silicon surface, which is always oxidized under atmosphere conditions.

This is because heating of polysilicon contaminated with organic polymers with exclusion of oxygen was expected to lead to reduction of the organic compound to carbon.

This would have been problematic since a subsequent reduction of the silicon oxide from the oxide layer of a silicon particle by the elemental carbon adhering on the particle surface to metallic silicon and volatile carbon dioxide is not possible at a temperature of 350° C. to 600° C. by the process according to the invention. Even at a temperature of up to 1400° C., this would not have been achievable.

Surprisingly, the selected heating ramps and the preferentially selected inert gas flow rate led, however, to a substantially residue-free thermal desorption of the surface carbon.

This nonoxidative cleaning process for hydrocarbons on silicon surfaces is surprisingly based on the physical principle of vaporization or of nonoxidative pyrolysis within a particular temperature range under particular gas-kinetic conditions.

Polyethylene has a melting temperature between 105 and 135° C. ($T_M$(PE–LD)=105-110° C.); ($T_M$(PE–HD)=130-135° C.) [2].

If polyethylene is exposed to elevated temperatures with exclusion of air, gaseous hydrocarbons are formed from 280° C. without decomposition of the polymer to the monomer, this effect being observed to an increased extent up to temperatures of 350° C.

The formation of large amounts of volatile products in the course of heating is a fundamental property of thermoplastic organic polymers, for example polyethylene and polypropylene, polypropylene being thermally stable up to 315° C.

The melting point of polypropylene is 158 to 166° C.

Not only polypropylene itself but also most of the organic additives present in PP vaporize at temperatures up to approx. 300° C. and are thermally degraded or pyrolyzed at temperatures above 300° C.

In principle, the thermal stability of unstabilized polypropylene is lower than that of polyethylene.

Halogenated polymers, for example PVDF, are much more stable to thermal degradation.

PVDF is substantially stable up to temperatures of 410° C. and then forms gaseous cleavage products to a noticeable degree, including hydrogen fluoride as the main product.

Polyurethane (PUR), in contrast, decomposes under inert gas atmosphere within a very broad temperature range between 245 and 535° C. in two stages with the two maxima at 353 and 414° C., and a carbonized residue of approx. 15%.

In the lining of parts of the comminution tools, preference is given to the use of plastics which can be removed completely from the silicon surface by thermal desorption.

Particular preference is given to the use of polyethylene and polypropylene.

d) Wet-Chemical Cleaning of the Polycrystalline Silicon

Optionally, the polycrystalline silicon is cleaned.

For this purpose, the polysilicon chunks are washed with an oxidizing cleaning solution in at least one stage in a pre-purifying operation, washed with a cleaning solution comprising nitric acid and hydrofluoric acid in a further stage in a main purifying operation, and washed with an oxidizing cleaning fluid in yet a further stage in a hydrophilizing operation.

The pre-cleaning operation is preferably effected by means of $HF/HCl/H_2O_2$. The silicon surface is preferably hydrophilized by means of $HCl/H_2O_2$.

The cleaning system is preferably within a cleanroom of class 10,000 or lower, preferably in a cleanroom of class 100 or better.

e) Packing of the Polycrystalline Silicon

The polycrystalline silicon is preferably packed according to US 2010154357A. By using a freely suspended and movable energy absorber for filling of the plastic bags, energy absorber and plastic bag consisting of a low-contamination material, the contamination of the polycrystalline silicon with carbon as a result of packing can be restricted to max. 300 pptw or max. 0.3 ppbw.

Measurement of Surface Contamination with Carbon a) By Means of an Automatic Analyzer The quantitative determination of the surface carbon content of polycrystalline silicon is performed on a modified RC612 carbon analyzer from Leco Corporation, USA, by the complete oxidation of all surface carbon contamination with oxygen to carbon dioxide.

The carbon dioxide concentration in the analysis gas is determined as standard by means of an infrared flow measurement cell integrated in the instrument.

The result is subsequently calculated as the proportion by mass of surface carbon based on the sample mass.

The analyzer was additionally equipped with a unit for oxygen pre-purification.

Prior to contact with the analysis sample, this unit oxidizes possible traces of hydrocarbons in the oxygen catalytically with copper oxide at 600° C. to carbon dioxide, and the carbon dioxide formed and water are removed completely from the oxygen by means of suitable absorption media (magnesium perchlorate and sodium hydroxide).

This prepurification allows the use of technical oxygen from pressurized gas bottles with a purity of >99.5% ($O_2$ quality 2.5).

Experiments with very pure oxygen of 5.0 quality (>99.999%) did not lead to an improved result.

After the prepurification, the oxygen is conducted into the horizontal heated quartz oven tube.

The oven tube is a system open to the atmosphere.

The penetration of air into the oven tube is prevented by a permanent purge flow of 4 L/min with prepurified oxygen in the direction of the oven tube opening to the atmosphere.

A smaller flow of 0.75 L/min of prepurified oxygen is conducted in the opposite direction to the oven tube opening and passes over the sample placed in a sample boat at the analysis position.

The oven temperature at the analysis position is constant at 1000° C.

All measurements, such as calibration, sample and blank value measurements, are conducted at this temperature.

The analysis gas, enriched with the oxidation products from the reaction of the oxygen with the surface carbon contamination of the polycrystalline silicon, after leaving the oven tube, is passed through a postcombustion chamber at 850° C. and then oxidized fully to carbon dioxide over a copper oxide catalyst at 750° C.

The carbon dioxide content in the analysis gas is subsequently measured as standard by means of infrared spectroscopy in a flow analysis cell having a length of 152.4 mm (6 inches) at ~2349 $cm^{-1}$.

Before the analysis gas leaves the instrument via an exhaust, it is cleaned to remove carbon dioxide and water by absorption media which are also used in the oxygen prepurification.

The instrument is calibrated with calcium carbonate standards in quartz sample boats.

In order to prevent entrainment, sample analyses and blank determination are performed in a quartz boat provided specially for that purpose.

Since, in the case of analyses in the trace range, influences such as carbon dioxide from the ambient air adsorbed on the quartz boat and standard house dust in the laboratory, for example, can distort the analysis result, the empty analysis boat is present permanently in the front region of the oven tube, with minor exceptions.

The temperature in this region of the oven tube is approx. 350° C.

This oven region is purged permanently with previously purified oxygen.

The blank analyses which take place immediately before each sample analysis are performed with this empty analysis boat.

Exactly the analysis process described as follows is run through, but without sample material.

Due to the sensitivity of the analysis, five blank measurements are performed before each new sample series. If these blank values are at baseline level, the instrument is ready for the analysis.

To determine the surface carbon content in a silicon sample, approx. 1.5 g of this sample are weighed into a quartz weighing boat on an analytical balance.

An example of a suitable balance is the CPA224S model from Sartorius AG, Germany.

By pressing a button, the exact starting weight is transmitted to the analyzer via an interface.

The empty analysis boat present in the front region of the oven tube is then removed from the oven tube for cooling under ambient air to <100° C. for a period of 100-300 s, preferably 120 s, and stored with substantial protection from dust.

After cooling, about half of the empty analysis boat is inserted into the open oven tube, such that transfer of the sample from the weighing boat into the cooled analysis boat purged with prepurified oxygen is still possible.

The sample-filled boat is subsequently pushed into the analysis position with a quartz gripper and the analysis is started manually.

After an analysis time of 55 s, the analysis is complete.

The result is displayed on the analyzer in the unit of ppmw.

The analysis boat is subsequently pushed to the front end of the oven tube with the gripper, emptied and cooled, as described above, by positioning it in front of the analyzer with substantial freedom from dust.

Four repeat analyses of the same sample (corresponding to one sample series) are then made in succession, and the arithmetic mean is calculated from the analysis results of a sample series.

A sample series is followed by a further blank analysis in order to check whether any drift has taken place during a sample series.

In order to be able to estimate any analysis error in the event of possible incomplete oxidation of carbon compounds to carbon monoxide, which cannot be detected by means of the standard IR analysis cell, additional gas measurements were performed.

Since all of the offgas from the combustion catalyst is released into the ambient air, for protection of the operating personnel working in the immediate environment of the instrument, concentration measurements have to be performed in the analysis gas with respect to carbon dioxide and carbon monoxide at very low analytical detection limits.

The carbon dioxide content in the analysis gas measured immediately downstream of the integrated IR analysis cell thus corresponds to the maximum pollution of the breathable ambient air in the analysis room in the event of total failure of the carbon dioxide adsorber upstream of the offgas exhaust.

Any carbon monoxide formed would be released directly to the breathable air.

To check the carbon monoxide and carbon dioxide concentrations in the analysis gas immediately downstream of the IR analysis cell, the Prismati™ multicomponent analyzer from Tiger Optics LLC, USA, was used, this being able to determine simultaneously, as well as further components in the gas, carbon monoxide and carbon dioxide with detection limits of 100 ppb for each.

Cavity ring-down spectroscopy (CRDS) which is thus used has much stronger detection power than infrared spectroscopy.

For performance of the analysis, the analysis gas, immediately downstream of the IR flow analysis cell, was conducted through a tube to the flow analysis cell of the CRDS.

The analysis gas which has flowed through the two flow analysis cells then flows through the last two absorbers of the combustion analyzer in order then to be released to the ambient air via the exhaust.

The presence of toxic carbon monoxide in the analysis gas could not be detected by means of CRDS at any time during the analysis.

It can thus be assumed that, under the conditions which exist in the combustion oven, complete oxidation of carbon compounds to carbon dioxide proceeds during the analysis and hence the error resulting from incomplete oxidation tends to zero.

The carbon dioxide concentrations measured by means of CRDS in the analysis gases were likewise at no time within a range of concern for occupational safety.

Surprisingly, however, in the case of use of CRDS as a carbon dioxide detector, compared to the standard IR analysis cell of the combustion analyzer, a much lower analytical detection limit was found.

The analytical detection limit (DL) in the determination of the surface carbon concentration by means of CRDS as the analysis principle for the carbon dioxide concentration measurement in the analysis gas is 0.020 ppmw (20 ppbw).

The entire analysis process for determination of the surface carbon contamination is performed in a laminar flow box with purity class 7 (10,000; to ISO 14644-1).

Immediately upstream of the laminar flow box, a cleanroom of purity class 8 (100,000; to ISO 14644-1) was constructed, which serves as a lock or rest room for the operating personnel.

This clean environment distinctly reduces environmental influences by dust in the determination of the surface carbon concentration on polycrystalline silicon.

b) Improved Analysis Method with Lower Detection Limit

In the case of a carbon concentration of less than 20 ppbw, an alternative analysis method is used.

The carbon surface impurities of polycrystalline silicon can also be determined by analyzing one of two polycrystalline silicon rods produced by deposition in a Siemens reactor for contamination with carbon (bulk and surface) immediately after the deposition, while the second rod passes through the systems in which the rod is processed further and, after passing through the systems, is likewise analyzed for contamination with carbon (bulk and surface). Since both rods can be assumed to have the same level of bulk contamination, the difference in the two contaminations determined gives the surface contamination which is caused by the further processing steps such as comminution, cleaning, transportation. This can be ensured at least when the rod and brother rod thereof have been deposited on one and the same U-shaped support body.

On a workbench with lateral surfaces made from plastic, a polycrystalline silicon rod is comminuted by means of a hammer made from hard metal with a plastic shaft.

The workbench is in a cleanroom of the 10,000 class with cleanroom filters having a PTFE membrane.

Manual handling of the rod is effected by means of gloves made from high-purity PE.

A polycrystalline rod of length 10 to 20 cm with a diameter of 1.6 cm is placed at the side of the workbench for 10 minutes. This time corresponds to the mean residence time of the material on the workbench before it is packed into the PE bag.

In addition, the rod placed on the workbench is conducted through the crusher without comminuting it, as a result of which, however, it is exposed to the environment of the crusher.

The crusher is within a cleanroom of the 10,000 class.

For lining of metal parts in the crusher, polypropylene and polyethylene were used.

After passing through the crusher, the rod is packed and then analyzed for contamination with carbon.

This is done by means of FTIR (SEMI MF 1188, SEMI MF 1391).

This involves first growing an FZ single crystal from the polycrystalline rod. A wafer is then removed from the single crystal and analyzed by means of FTIR.

The polycrystalline rod analyzed has a brother rod which has been deposited simultaneously under the same conditions on a U-shaped support body in a Siemens reactor. After the deposition, the U-shaped support body was removed from the reactor, and the bridge was removed, so as to obtain one rod and one brother rod in each case. Immediately after the deposition, the brother rod was packed in a PE bag and then analyzed by means of FTIR for contamination with carbon.

Since both rods, rod and brother rod, were deposited on the same U-shaped support body under the same conditions, they had the same level of carbon contamination after deposition.

The polycrystalline rod which had been placed on the workbench during the comminution and conducted through the crusher was, however, subsequently exposed to the environment of the comminuting operations and was possibly contaminated as a result. Forming the difference between the carbon concentrations determined for rod and brother rod gives the contamination with carbon at the surface.

It has been shown that the additional contamination by the inventive cleaning by means of thermal treatment has been restricted to an extremely low level.

EXAMPLES

The invention is illustrated hereinafter by examples.

Example 1

After the mechanical processing operations had ended, i.e. precomminution and comminution to CS 1 as described in b) comminution of the polycrystalline silicon, a portion of approx. 5 kg of polycrystalline silicon of chunk size 1 was taken.

From this portion, in turn, a representative sample of approx. 0.1 kg was taken for determination of the surface carbon contamination prior to the thermal cleaning operation.

The surface carbon concentration of this material is typically within a range between 70 and 180 ppbw.

The remaining 4.9 kg of polycrystalline silicon were subjected to the inventive thermal cleaning operation.

This was done by spreading the polycrystalline silicon to be cleaned on a quartz or silicon process dish.

This material was subsequently exposed to a temperature of 500° C. in an oven for a duration of 30 s under an inert argon atmosphere without gas flow, and thus with exclusion of oxygen.

The inert gas positive pressure was negligibly low.

After the thermal cleaning operation and the cooling of the polycrystalline silicon to room temperature, another representative sample of approx. 0.1 kg was taken from the remaining amount for determination of the surface carbon contamination.

The sample vessels used may either be vessels made from plastic, for example high-purity plastic bags, or made from glass.

In the example, a commercial wide-neck laboratory glass flask made from borosilicate glass was used.

The determinations of the surface carbon contaminations of the samples prior to and after the thermal cleaning were effected as already described above (automatic analyzer).

These analyses were conducted on a total of ten production batches.

Table 1 shows how the concentration of surface carbon is improved by an inventive thermal purifying operation without inert gas flow for polycrystalline silicon of chunk size 1.

TABLE 1

| Batch | Surface carbon contamination prior to thermal cleaning [ppmw] | Surface carbon contamination after thermal cleaning [ppmw] |
|---|---|---|
| 1 | 0.133 | 0.022 |
| 2 | 0.085 | 0.025 |
| 3 | 0.162 | 0.021 |
| 4 | 0.096 | 0.027 |
| 5 | 0.176 | 0.035 |
| 6 | 0.142 | 0.022 |
| 7 | 0.128 | 0.032 |
| 8 | 0.157 | 0.022 |
| 9 | 0.149 | 0.029 |
| 10 | 0.121 | 0.026 |

Example 2

Here too, after the mechanical processing operations had ended, a portion of approx. 5 kg of polycrystalline silicon of chunk size 1 was taken.

From this portion, in turn, a representative sample of approx. 0.1 kg was taken for determination of the surface carbon contamination prior to the thermal cleaning operation.

The surface carbon concentration of this material is typically within a range between 70 and 180 ppbw.

The remaining 4.9 kg of polycrystalline silicon were subjected to the inventive thermal cleaning operation.

This was done by spreading the polycrystalline silicon to be cleaned on a quartz or silicon laden process dish.

This material was subsequently exposed to a temperature of 500° C. in an oven for a duration of 30 s under a constant argon flow rate of 100 L/min, and thus with exclusion of oxygen.

The inert gas positive pressure was negligibly low.

After the thermal cleaning operation and the cooling of the polycrystalline silicon to room temperature, another representative sample of approx. 0.1 kg was taken from the remaining amount for determination of the surface carbon contamination.

The sample vessel used was a wide-neck laboratory glass flask made from borosilicate glass.

The determinations of the surface carbon contaminations of the samples prior to and after the thermal cleaning were effected as described above (automatic analyzer).

These analyses were conducted on a total of ten production batches.

Table 2 shows how the concentration of surface carbon is improved by an inventive thermal purifying operation under inert gas flow for material of chunk size 1.

The values determined after the thermal cleaning were below the detection limit of the analyzer, i.e. less than 20 ppbw.

Thermal cleaning under inert gas flow is thus particularly effective and is therefore particularly preferred in the context of the invention.

TABLE 2

| Batch | Surface carbon contamination prior to thermal cleaning [ppmw] | Surface carbon contamination after thermal cleaning [ppmw] |
|---|---|---|
| 1 | 0.178 | <0.020 |
| 2 | 0.139 | <0.020 |
| 3 | 0.142 | <0.020 |
| 4 | 0.159 | <0.020 |
| 5 | 0.176 | <0.020 |
| 6 | 0.078 | <0.020 |
| 7 | 0.135 | <0.020 |
| 8 | 0.169 | <0.020 |
| 9 | 0.113 | <0.020 |
| 10 | 0.122 | <0.020 |

Example 3

27 polycrystalline silicon rods, each of length 10 to 20 cm and each having a diameter of 1.6 cm, were exposed to the conditions of the precomminution and of the processing with a crusher.

The rods were each placed on a workbench while a rod was comminuted by means of a hammer thereon. In addition, the rods were conducted through the crusher without undertaking comminution.

This was followed by a thermal treatment of each of these rods analogously to Example 2.

In a departure from Example 2, there followed an additional wet-chemical operation.

It has been found that the additional wet-chemical cleaning leads to even better values than in Example 2 for surface contamination with carbon.

In this case, the aforementioned alternative analysis method had to be used, this enabling the quantitative determination of surface carbon contamination by means of better-detecting FTIR spectroscopy.

The reference used in each case was an untreated brother rod from a U-shaped carrier body from the same deposition batch. Every two filament rods were coupled via a horizontal bridge during the deposition and formed that U-shaped support body for the silicon deposition. After deposition, two rods resulted in each case after removal of the bridge: rod and brother rod.

After deposition and removal of the bridge, rod and brother rod were each packed in a PE bag.

For all 27 rods and brother rods, the procedure was as follows:

The brother rod was transported to a laboratory for determination of the carbon concentration.

The rod was conducted through production.

The PE bag was opened using ceramic scissors. After the bag had been opened, the rod was removed manually by means of a high-purity PE glove.

Subsequently, the rod was placed onto the workbench for manual precomminution of silicon rods on the production scale.

It had to be ensured that the rod remained mechanically undamaged, i.e. did not break up, during the passage thereof through all mechanical processing operations.

The workbench was subsequently laden with a silicon rod from production.

The precomminution was effected on a workbench having a surface which consisted of polypropylene. The lateral parts of the bench were likewise covered with polypropylene. It was likewise also possible to use polyethylene, polyvinylidene fluoride (PVDF), polyurethane (PUR) and polyamide (PA) as the surface and for covering.

For comminution, a hammer made from a low-abrasion material, for example hard metal, was used. The hammer shaft consisted of polypropylene. It was likewise also possible to use polyethylene, polyurethane, polyamide and polyvinylidene fluoride (PVDF).

During the precomminution of the polysilicon rod from production, the rod maintained direct contact with the crushed silicon and the plastic used on the workbench.

The rod was thus contaminated during the precomminution in the same way as the crushed polysilicon of the rod from production, since the rod was rubbed intensively with plastic in the same way.

This was followed by comminution of the crushed silicon to chunk sizes CS0 to CS4.

The comminution was effected by means of a jaw crusher.

Metal parts of the crusher were lined with polypropylene and polyethylene.

Both systems, both workbench and hammer for precomminution, and crusher, were within a cleanroom of the 100 class or lower.

Subsequently, the crushed silicon was classified into chunk sizes by means of a mechanical sieve, and the mechanical sieve was lined with polypropylene.

At the end of the mechanical processing operations, the dust was embedded into a conical bed composed of crushed polysilicon of chunk size CS0.

This intensive contact between rod and CS0 chunk polysilicon ensured that the rod was contaminated with surface contamination in the same type and amount as also present on the surface of the CS0 chunk polysilicon.

The surface carbon concentration of polysilicon of chunk size CS0 is typically between 0.400 and 0.600 ppmw.

The storage time of the rod in the conical bed was 15 minutes.

The contaminated rod was subsequently removed from the conical bed. This was done manually by means of a PE glove. The rod was packed in a high-purity PE bag which was welded shut.

The packaged rod was subsequently transported to the oven in order to conduct the inventive thermal desorption.

The PE bag in which the contaminated rod had been packed was opened by means of ceramic scissors. The rod was withdrawn and placed onto a quartz or silicon process dish in the oven, using a high-purity PE glove for manual removal and for introduction into the oven.

Then the inventive thermal cleaning was effected in the oven.

The thermally treated rod was subsequently subjected to a wet-chemical cleaning operation.

For this purpose, the thermally cleaned rod was treated in a three-stage wet-chemical operation. The preliminary cleaning and the main cleaning were effected in separate acid circuits:

a) Preliminary Cleaning in Etchant

Cleaning for 20 min in a mixture of 5% by weight of HF, 8% by weight of HCl, 3% by weight of $H_2O_2$ at a temperature of 22° C.

Material removal: 0.02 μm b) Rinsing with 18 MOHM ultrapure water at 22° C. for 5 minutes c) Main cleaning: etching at 8° C. for 5 min $HF/HNO_3$ with 6% by weight of HF, 55% by weight of $HNO_3$ and 1% by weight of Si Etching removal: approx. 30 μm d) Rinsing with 18 MOHM ultrapure water at 22° C. for 5 min.

e) Hydrophilization in water at 22° C. saturated with 20 ppm of ozone for 5 min.

f) Drying with ultrapure air of the 100 class at 80° C. for 60 min g) Cooling with ultrapure air, 22° C.

Finally, the wet-chemically treated rod was packed by means of a PE glove in a high-purity PE bag.

Finally, the thermally treated and subsequently wet-chemically cleaned rod was analyzed for contamination with carbon.

For this purpose, the rod was processed by means of a FZ to give a monocrystalline rod.

The effect of this is that all impurities adhering on the surface of the rod, preferably carbon impurities, are distributed into the mass of the single crystal which forms by the FZ operation.

The carbon concentration in the silicon of the FZ-pulled rod was determined by means of FTIR spectroscopy.

The untreated brother rod was also subjected to such an analysis. However, it was not necessary here first to produce an FZ single crystal. A wafer of polycrystalline silicon was removed from the brother rod and sent to FTIR analysis.

In this manner, the carbon concentration was determined for all 27 rods and for all 27 brother rods. The differences between the carbon measurements from the rods and the corresponding brother rods then give the values which were attributed to the surface carbon contamination of the polysilicon.

Table 3 shows the differences determined for carbon surface contaminations.

TABLE 3

| Sample # | C difference [ppbw] |
|---|---|
| 1 | 1.48 |
| 2 | 1.79 |
| 3 | 7.14 |
| 4 | 1.63 |
| 5 | 4.56 |
| 6 | 4.50 |
| 7 | 3.05 |
| 8 | 6.80 |
| 9 | 7.04 |
| 10 | 6.04 |
| 11 | 8.50 |
| 12 | 5.11 |
| 13 | 0.50 |
| 14 | 5.80 |
| 15 | 4.96 |
| 16 | 8.20 |
| 17 | 7.79 |
| 18 | 1.24 |
| 19 | 8.00 |
| 20 | 8.50 |
| 21 | 7.10 |
| 22 | 0.56 |
| 23 | 4.88 |
| 24 | 1.65 |
| 25 | 5.15 |
| 26 | 6.00 |
| 27 | 8.00 |

With the aid of the rod/brother rod analysis method, it is also possible to detect small contaminations well below 20 ppbw. Since the chunk size 0 examined here is known to have the highest surface contamination with carbon, the results show that the inventive polycrystalline silicon has contamination within the range claimed for all chunk sizes.

In addition, it becomes clear that an additional wet-chemical cleaning step can reduce contamination with carbon at the surface always to less than 10 ppbw, and in some cases to less than 5 ppbw down to a level of 0.5 ppbw.

What is claimed is:

1. A process for cleaning polycrystalline silicon chunks having carbon contamination at a surface thereof, said process comprising a thermal treatment of the polycrystalline silicon chunks in a reactor at a temperature of 350 to 600° C., the polycrystalline silicon chunks being present in an inert gas atmosphere during the thermal treatment, and the polycrystalline silicon chunks after the thermal treatment having a concentration of carbon at the surface of 0.5-35 ppbw.

2. The process as claimed in claim 1, wherein the thermal treatment is effected at a constant inert gas flow between 0-250 L/min.

3. The process as claimed in claim 1, wherein the inert gas is a member selected from the group consisting of noble gases and nitrogen.

4. The process as claimed in claim 3, wherein the inert gas used is argon.

5. The process as claimed in claim 1, wherein the thermal treatment is effected with exclusion of oxygen.

6. The process as claimed in claim 1, wherein the thermal treatment is effected for a duration of up to 180 seconds.

7. The process as claimed in claim 1, wherein the thermal treatment is followed by withdrawal of the thermally treated polycrystalline silicon chunks from the reactor and cooling thereof to room temperature with inert gas purging.

8. The process as claimed in claim 2, wherein the inert gas is a member selected from the group consisting of noble gases and nitrogen.

9. The process as claimed in claim 8, wherein the inert gas used is argon.

10. The process as claimed in claim 9, wherein the thermal treatment is effected with exclusion of oxygen.

11. The process as claimed in claim 10, wherein the thermal treatment is effected for a duration of up to 180 seconds.

12. The process as claimed in claim 11, wherein the thermal treatment is followed by withdrawal of the thermally treated polycrystalline silicon chunks from the reactor and cooling thereof to room temperature with inert gas purging.

* * * * *